(12) United States Patent
Kishida et al.

(10) Patent No.: US 6,313,005 B1
(45) Date of Patent: Nov. 6, 2001

(54) METHOD OF MANUFACTURING SEMICONDUCTOR DEVICE

(75) Inventors: Takeshi Kishida, Hyogo; Akinori Kinugasa, Tokyo; Yoji Nakata, Tokyo; Tomoharu Mametani, Tokyo; Shigenori Kido, Tokyo; Yukihiro Nagai, Tokyo; Hiroaki Nishimura, Tokyo; Jiro Matsufusa, Tokyo, all of (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/610,428

(22) Filed: Jul. 5, 2000

(30) Foreign Application Priority Data

Jan. 13, 2000 (JP) .................................. 12-004733

(51) Int. Cl.[7] .................................. H01L 21/20
(52) U.S. Cl. .................. 438/398; 438/253; 438/255; 438/396
(58) Field of Search .................... 438/253, 255, 438/396, 398

(56) References Cited

U.S. PATENT DOCUMENTS

| | | | |
|---|---|---|---|
| 5,827,766 | * 10/1998 | Lou | 438/253 |
| 6,174,781 | * 1/2001 | Dai et al. | 438/396 |
| 6,218,239 | * 4/2001 | Huang et al. | 438/253 |
| 6,241,741 | * 6/2001 | Kinugasa et al. | 438/396 |
| 6,258,691 | * 7/2001 | Kim | 438/398 |

FOREIGN PATENT DOCUMENTS 10-189895    7/1998   (JP) .

OTHER PUBLICATIONS

Wolf et al., Silicon Processing for the VLSI Era—Process Technology, (Lattice Press, California, 1986), pp. 423, 441, 518, 564–565.*

* cited by examiner

Primary Examiner—Amir Zarabian
Assistant Examiner—Christian D. Wilson
(74) Attorney, Agent, or Firm—Oblon, Spivak, McClelland, Maier & Neustadt, P.C.

(57) ABSTRACT

Provided is a method of manufacturing a semiconductor device having a capacitor above a semiconductor substrate, with which it is possible to reduce the number of steps and the cost of manufacture. Specifically, a polysilicon layer (12) in which impurity is diffused is deposited on the entire surface including the inside of a hole (8A). An etching process of the polysilicon layer (12) is performed to form a storage node electrode composed of the polysilicon layer (12) remaining on the bottom and side of a groove for metallization (15) and in the hole (8A). The storage node electrode is broadly divided into a storage node electrode body disposed on the bottom and side of the groove for metallization (15), and a plug part disposed in the hole (8A). The storage node electrode is electrically connected via the plug part to a diffused region (19) of a semiconductor substrate (1).

11 Claims, 6 Drawing Sheets

F/G. 11 (BACKGROUND ART)
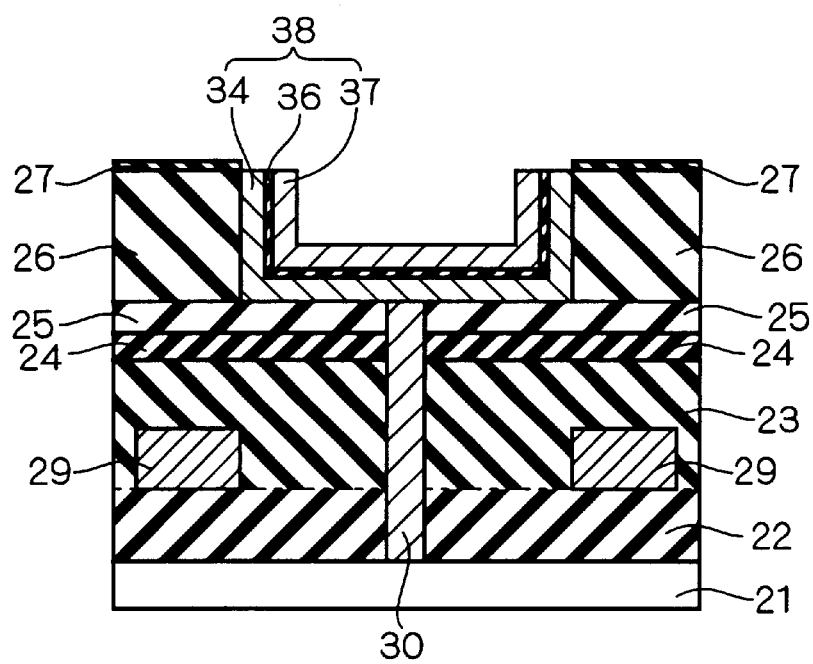

METHOD OF MANUFACTURING SEMICONDUCTOR DEVICE

BACKGROUND OF THE INVENTION

1. Field of the Invention

The present invention relates to a method of manufacturing semiconductor devices having a capacitor above a semiconductor substrate, such as of a hollow cylindrical capacitor structure.

2. Description of the Background Art

In manufacturing a semiconductor device having a capacitor above a semiconductor substrate, such as DRAMs having a memory cell of a hollow cylindrical capacitor structure, it has been necessary to form a storage node direct contact for electrical connection between a storage node electrode disposed above the capacitor and the semiconductor device components disposed on the semiconductor substrate.

FIGS. 9 to 11 are cross sections illustrating steps in a conventional method of manufacturing a DRAM having a memory cell of a hollow cylindrical capacitor structure. Specifically, FIGS. 9 and 10 show intermediate stages of manufacture, and FIG. 11 shows the final product.

Referring to FIG. 9, an interlayer BP (Boron, Phosphorus)-TEOS layer 22, interlayer BP-TEOS layer 23, SS (Storage node Stopper) nitride film 24 and interlayer BP-TEOS layer 25 are disposed on a semiconductor substrate 21. Bit line 29 is selectively disposed on the interlayer BP-TEOS layer 22. The structure so constructed is subjected to photolithography and etching process, to form a hole extending through the interlayer BP-TEOS layer 25, SS nitride layer 24, interlayer BP-TEOS layer 23 and interlayer BP-TEOS layer 22, thereby to provide a plug 30 composed of polysilicon in the hole.

Referring to FIG. 10, an interlayer BP-TEOS layer 26 is formed on the interlayer BP-TEOS layer 25 including the plug 30, an upper TEOS layer 27 is formed on the interlayer BP-TEOS layer 26, and a patterned resist 31 is formed on the upper TEOS layer 27.

By using the resist 31 as a mask, an etching process of the upper TEOS layer 27 and interlayer BP-TEOS layer 26 is performed to form a hollow cylindrical groove for metallization (not shown). Then, as shown in FIG. 11, a storage node electrode 34, capacitor insulating film 36 and cell plate node electrode 37 are formed successively, thereby obtaining a capacitor 38 of a hollow cylindrical structure consisting of these components 34, 36 and 37. At this time, the plug 30 functions as a storage node direct contact (i.e., a direct contact between the storage node electrode 34 of the capacitor 38 and a component disposed on the surface of the semiconductor substrate 21).

The conventional method of manufacturing DRAMs of a hollow cylindrical capacitor structure is performed as described above, which necessitates the step of forming the plug 30 for storage node direct contact. This step therefore causes an increase in the number of steps and in the cost of manufacture.

SUMMARY OF THE INVENTION

According to a first aspect of the invention, a method of manufacturing a semiconductor device comprises the steps of: (a) forming successively first and second layers on a semiconductor substrate; (b) forming a hole so as to extend through the first and second layers; (c) forming a groove for metallization in the second layer so as to selectively extend through the second layer including the hole; (d) forming a first electrode layer on the bottom and side of the groove for metallization, while filling the inside of the hole remained, the first electrode layer having a contact part filled in the inside of the hole remained and an electrode part disposed on the bottom and side of the groove for metallization; and (e) forming successively an insulating film and a second electrode layer on the electrode part of the first electrode layer, thereby to obtain a capacitor consisting of the electrode part, the second electrode layer and the insulating film.

With this method, in the step (d) it is possible to form the first electrode layer which includes the contact part filled in the hole remained and the electrode part disposed on the bottom and side of the groove for metallization.

Therefore, the contact part and electrode part, which have conventionally been formed in different steps, can be formed at the same time, thereby permitting reductions in the number of steps and in the cost of manufacture.

According to a second aspect, the method of the first aspect further comprises the steps of: (f) filling the hole to form an auxiliary layer, which step is performed after the step (b) and before the step (c); and (g) removing the auxiliary layer in the hole remained, which step is performed after the step (c) and before the step (d).

With this method, the hole is filled to form an auxiliary layer in the step (f), which is performed after the step (b) and before the step (c), and the auxiliary layer protects the semiconductor substrate from damage to be exerted via the hole, in the step (c).

According to a third aspect, the method of the second aspect is characterized in that: the step (a) includes the steps of (a-1) forming the first layer on the semiconductor substrate, (a-2) forming a stopper layer on the first layer, and (a-3) forming the second layer on the stopper layer; that the step (b) includes the step of forming the hole so as to extend through the first layer, the stopper layer and the second layer; that the step (c) includes the steps of (c-1) forming a resist patterned on the second layer, and (c-2) performing an etching process of the second layer by using the resist as a mask, to form the groove for metallization, the stopper layer having etching resistance to the etching process; and that the step (g) includes the step of removing the resist in addition to the auxiliary layer.

With this method, when in the step (c-2) the groove for metallization is formed by performing an etching process of the second layer by using the resist as a mask, it is able to reliably prevent removal of the first layer below the stopper layer, because the stopper layer has etching resistance to the etching process.

Preferably, in the method of the third aspect, the first and second layers include a TEOS layer, and the stopper layer includes a nitride film.

According to a fourth aspect, the method of the third aspect is characterized in that: the step (f) includes the step of forming the auxiliary layer on the second layer and also in the inside of the hole; that the step (c-1) includes the steps of (c-1-1) forming a resist material on the entire surface of the second layer, and (c-1-2) patterning the resist material to form the resist; and that the auxiliary layer includes an anti-reflective coating to prevent the reflection of light at the time of exposure for patterning in the step (c-1-2).

In this method, since the auxiliary layer includes the anti-reflective coating to prevent the reflection of light at the time of exposure for patterning in the step (c-1-2), the exposure process for the patterning can be performed with high precision.

Preferably, in the method of the fourth aspect, the anti-reflective coating includes a bottom anti-reflective coating.

According to a fifth aspect, the method of the third aspect is characterized in that: the auxiliary layer and the resist have a characteristic of being able to be removed by an identical removing means; and that the step (g) includes the step of removing the auxiliary layer and the resist at the same time, by using the identical removing means.

With this method, the number of steps can be reduced because of the step (g) in which the auxiliary layer and resist are removed at the same time, by a predetermined removing means.

Preferably, in the method of the fifth aspect, the identical removing means includes ashing cleaning.

According to a sixth aspect, the method of the third aspect further comprises the step of (h) forming a first component of a DRAM in the surface of the semiconductor substrate, which step is performed before the step (a), and is characterized in that: the capacitor includes a memory cell capacitor for the DRAM, and the contact part of the first electrode layer is electrically connected to the first component; and that the step (a-1) includes the steps of (a-1-1) forming a first partial layer on the semiconductor substrate, (a-1-2) selectively forming a second component of the DRAM on the first partial layer, and (a-1-3) forming a second partial layer on the first partial layer including the second component, the first layer including the first and second partial layers.

With this method, the manufacture of a DRAM having the first and second components and having a memory capacitor disposed in the second layer, can be performed with less steps and less cost of manufacture.

Preferably, in the method of the sixth aspect, the first component includes an electrode region of a transistor for selecting the memory cell capacitor, and the second component includes a bit line for selecting the memory cell capacitor.

Preferably, in the method of the sixth aspect, the first electrode layer includes a polysilicon layer in which impurity is diffused.

It is therefore an object of the present invention to provide a method of manufacturing a semiconductor device having a capacitor above a semiconductor substrate, with which it is possible to reduce the number of steps and the cost of manufacture.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 10 and 11 are cross sections illustrating a conventional method of manufacturing a memory cell of a hollow cylindrical capacitor structure.

DESCRIPTION OF THE PREFERRED EMBODIMENTS

Figure 1:
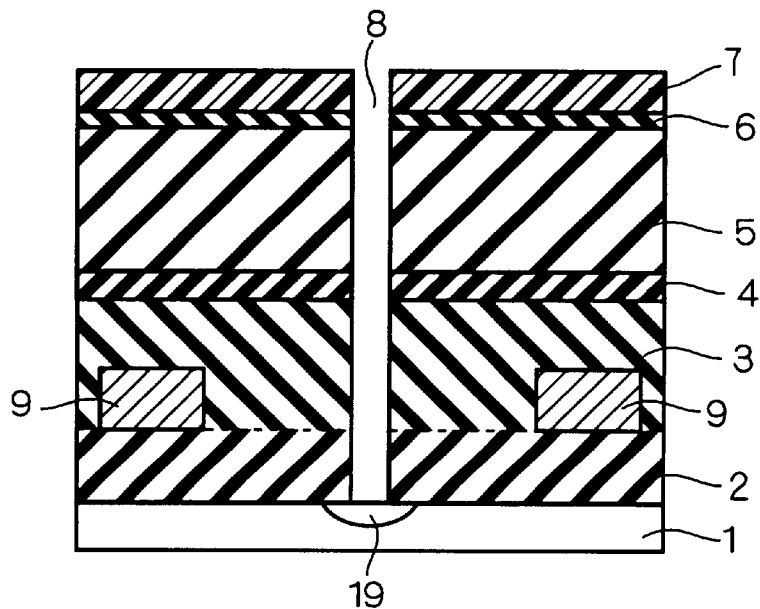
FIG. 1 is a cross section illustrating a method of manufacturing a cylindrical capacitor structure, according to a preferred embodiment of the present invention.

FIGS. 1 to 7 are cross sections illustrating a method of manufacturing a DRAM having a hollow cylindrical capacitor structure, according to a preferred embodiment of the invention. The procedure of this method will be described by referring to these figures. Firstly, the following processes are performed with the existing method.

A diffused region 19, which will become source/drain regions of a selective transistor of a memory cell, is formed on the surface of a semiconductor substrate 1, and an interlayer BP (Boron, Phosphorus)—TEOS layer 2 is formed on the semiconductor substrate 1. Thereafter, a bit line 9 composed of polysilicon is selectively formed on the interlayer BP-TEOS layer 2, and an interlayer BP-TEOS layer 3 is formed on the interlayer BP-TEOS layer 2 including the bit line 9. Then, SS (Storage node Stopper) nitride film 4, interlayer BP-TEOS layer 5, and upper TEOS layer 6 are successively formed on the interlayer BP-TEOS layer 3. The interlayer BP-TEOS layer 2, the interlayer BP-TEOS layer 3, and the SS nitride film 4 constitute a first insulating layer. The interlayer BP-TEOS layer 5 and upper TEOS layer 6 constitute a second insulating layer.

Referring now to FIG. 1, a resist 7, which is patterned by photolithography or the like, is formed on the upper TEOS layer 6. By using the resist 7 as a mask, an etching process is conducted to form a hole 8 so as to extend through the upper TEOS layer 6, interlayer BP-TEOS layer 5, SS nitride film 4, interlayer BP-TEOS layer 3 and interlayer BP-TEOS layer 2, thereby exposing the surface of the diffused region 19 of the semiconductor substrate 1.

Figure 2:
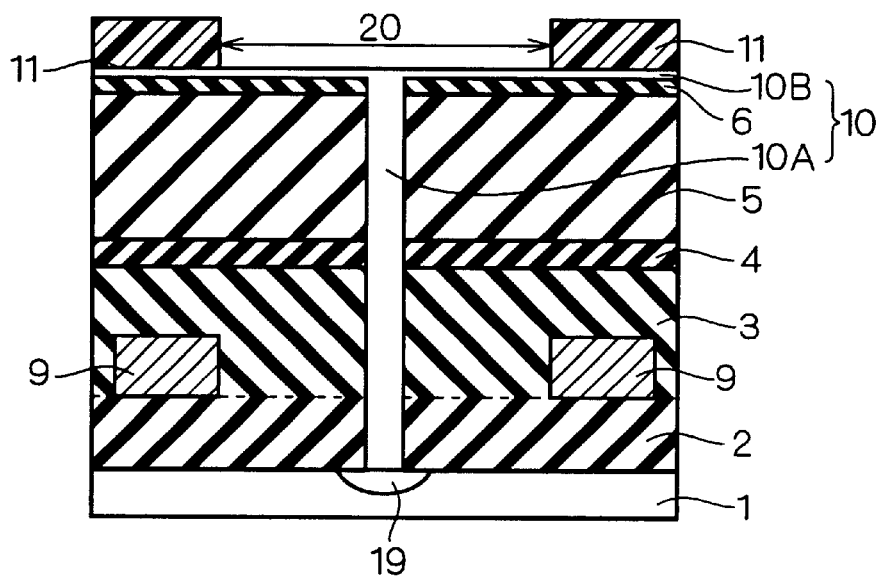
FIGS. 2 to 8 are cross sections illustrating a sequence of steps in a method according to the preferred embodiment.

Referring to FIG. 2, the resist 7 is removed with ashing cleaning, and BARC (Bottom Anti-Reflective Coating) material is applied to the entire surface of the interlayer BP-TEOS layer 5 including the inside of the hole 8, thereby to form a BARC layer 10. The BARC layer 10 is broadly divided into a BARC layer 10B disposed above the interlayer BP-TEOS layer 5, and a BARC layer 10A filled in the hole 8. Thereafter, a resist 11 patterned by photolithography or the like, is formed above the BARC layer 10. The patterned resist 11 is provided with an opening 20 which has the centrally located BARC layer 10A. Hereat, an organic material is used for forming the BARC layer 10 and resist 11.

In this step, the BARC layer 10 prevents the reflection of light when a resist material for the resist 11 is exposed in the photolithography. This enables to perform the exposure process for patterning with high precision. In place of the BARC layer, a plasma nitride film may be used.

Figure 3:
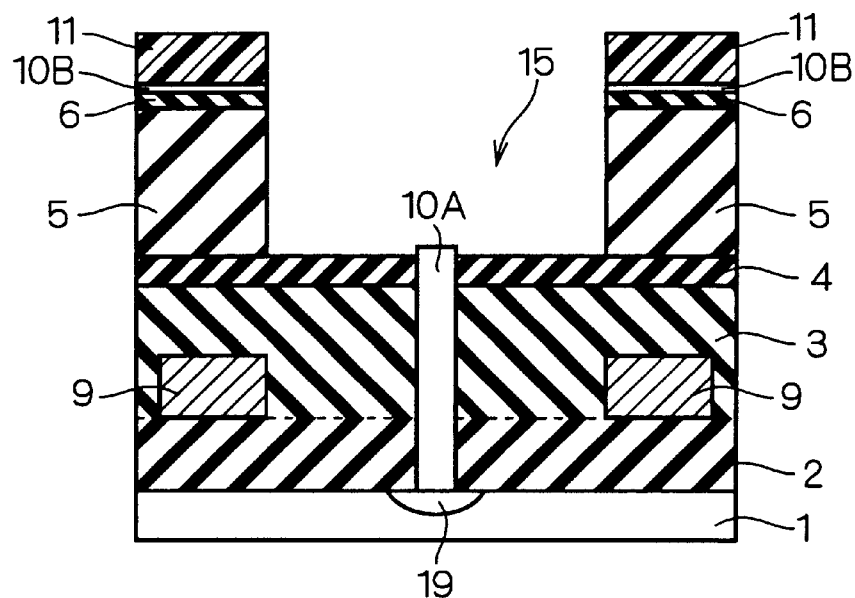

Referring to FIG. 3, by using the resist 11 as a mask, an etching process of the BARC layer 10, upper TEOS layer 6 and interlayer BP-TEOS layer 5, is performed to form a groove for metallization 15 on the SS nitride film 4.

At this time, the SS nitride film 4 has etching resistance to the etching process and is not removed by the etching process. The SS nitride film 4 can be formed in a relatively small thickness of about 50 nm, because it is merely required to exert the function of stopper to the etching process of the BP-TEOS layer 5, and is not employed as a mask in the etching process.

By the etching process, the BARC layer 10A is removed to the level of a region near to the surface of the SS nitride film 4 and, as the case may be, it is removed to a level lower than the surface of the SS nitride film 4. However, the BARC layer 10A cannot be removed to the extent that the surface of the diffused region 19 of the semiconductor substrate 1 is exposed. Therefore, the semiconductor substrate 1 or any element isolation oxide film etc., formed on the surface of the semiconductor substrate 1, cannot be removed by the etching process, so that the components disposed on the semiconductor substrate 1 are reliably protected.

Figure 4:
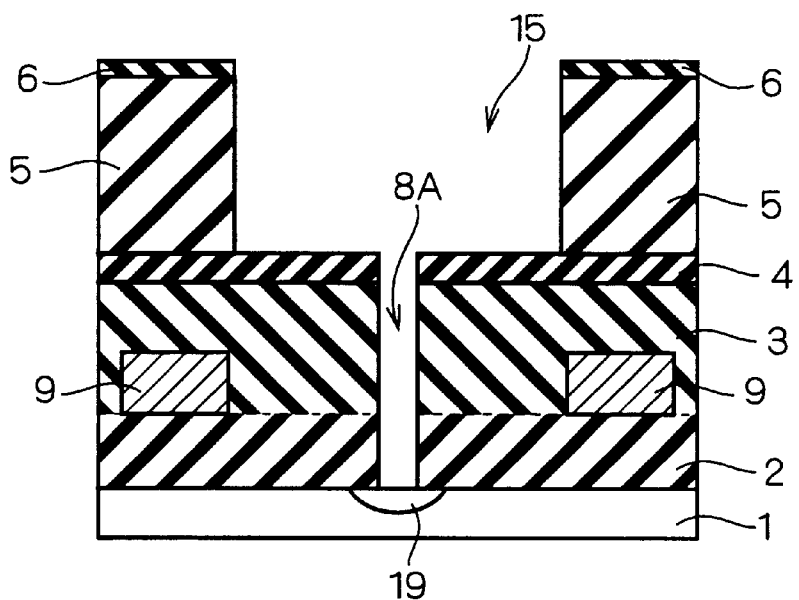

Referring to FIG. 4, with ashing cleaning, the resist 11 and BARC layer 10A are removed to reproduce the hole 8A extending through the SS nitride film 4, interlayer BP-TEOS layer 3 and interlayer BP-TEOS layer 2. Since the BARC layer 10A and resist 11 have a characteristic of being able to be removed with ashing cleaning, both can be removed at the same time. When a plasma nitride film is employed instead of the BARC layer, it is difficult to remove together with the resist 11, at the same time.

Figure 5:
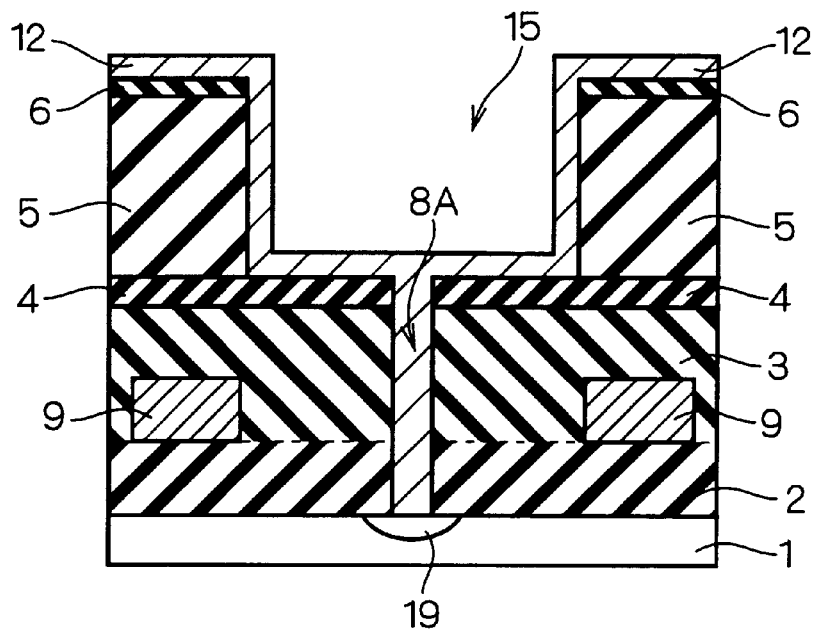

Referring to FIG. 5, a polysilicon layer in which impurity is diffused is deposited on the entire surface including the inside of the hole 8A. Hereat, the polysilicon layer 12 is formed so as to fill the hole 8A, and thus has an electrical connection relationship with the diffused layer 19 of the semiconductor substrate 1.

Figure 6:
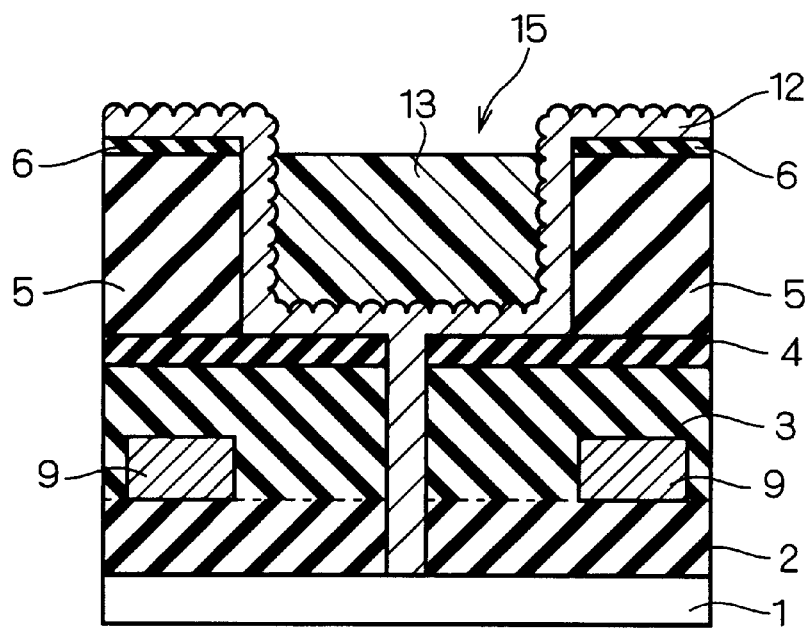

Referring to FIG. 6, amorphous silicon is deposited on the surface of the polysilicon layer 12, and the existing surface roughing process is conducted to roughen the surface of the polysilicon layer 12. Subsequently, a resist 13 is formed so as to fill the groove for metallization 15.

Figure 7:
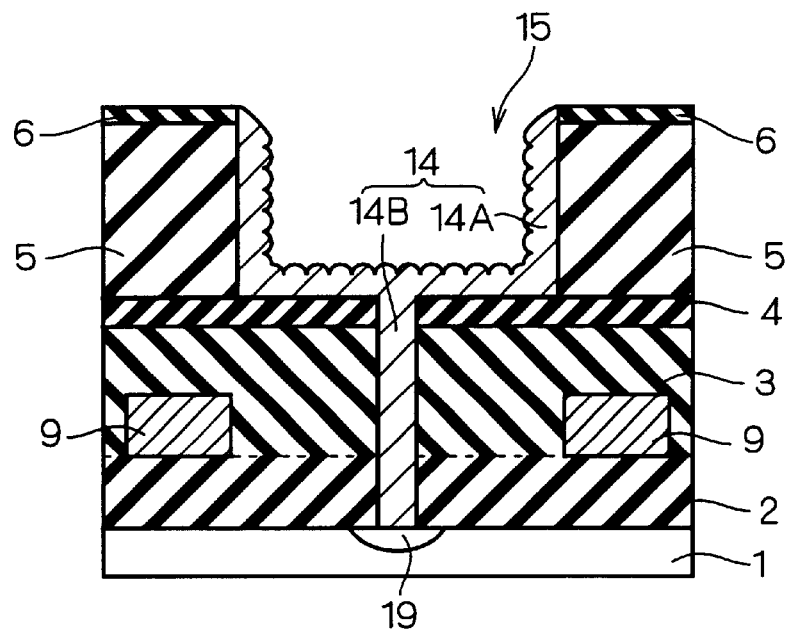

Referring to FIG. 7, by using the resist 13 as a mask, an etching process of the polysilicon layer 12 is conducted to such a degree that the polysilicon layer 12 on the surface of the upper TEOS layer 6 is removed. This results in a storage node electrode 14 composed of the polysilicon layer 12 that remains on the bottom and side of the groove for metallization 15 and remains in the hole 8A. The resist 13 is then removed with ashing cleaning.

The storage node electrode 14 is broadly divided into a storage node electrode body 14A (electrode part) disposed on the bottom and side of the groove for metallization 15, and a plug part 14B (contact part) disposed in the hole 8A. Accordingly, the storage node electrode body 14A and plug part 14B which have conventionally been formed in different steps, can be made in a single step.

Figure 8:
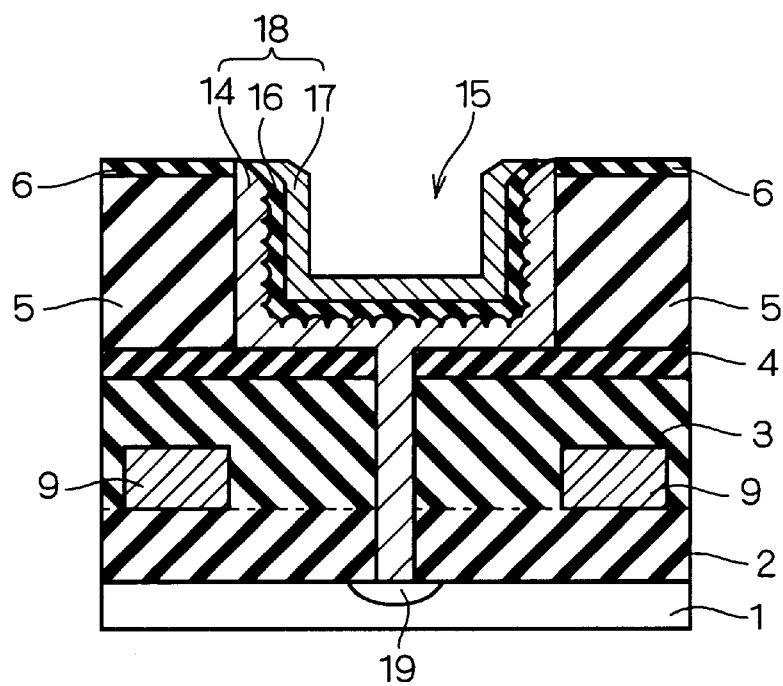

Referring to FIG. 8, a capacitor insulating film 16 and cell plate node electrode 17 are formed on the storage node electrode 14. This results in a capacitor 18 of a hollow cylindrical capacitor structure, having the storage node electrode body 14A, capacitor insulating film 16 and cell plate node electrode 17. The capacitor 18 is electrically connected, via the plug part 14B of the storage node electrode 14 in the hole 8A, to the diffused region 19 of the semiconductor substrate 1.

Thus, in the method of manufacturing a DRAM according to this preferred embodiment, when forming the storage node electrode 14, the storage node electrode body 14A and plug part 14B can be formed at the same time. This permits reductions in the number of steps and in the cost of manufacture, as compared with the conventional method in which the storage node electrode 14A and plug 14B are formed in different steps.

Figure 9:
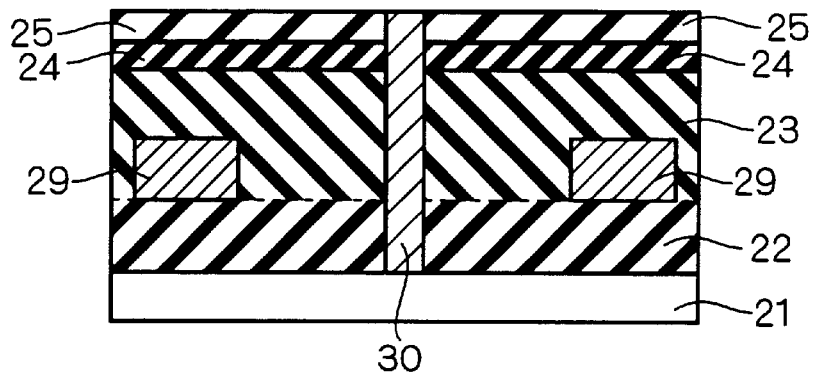
FIG. 9 is a cross section illustrating a conventional method of manufacturing a DRAM having a memory cell of a hollow cylindrical capacitor structure.
Figure 10:
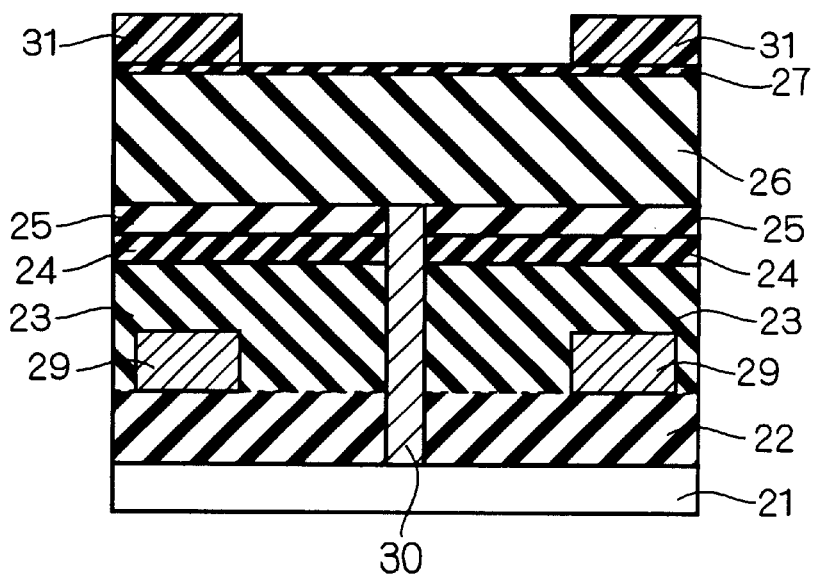

In the conventional steps as shown in FIGS. 9 to 11, for forming the plug 30 separately, the two interlayer BP-TEOS layers 25 and 26 are formed on the SS nitride film 24 in different steps. Whereas in this preferred embodiment, since in forming the storage node electrode 14, the storage node electrode body 14A and plug part 14B are formed at the same time, it is merely required to form a single interlayer BP-TEOS layer 5 on the SS nitride film 4 in a single step. Therefore, one step of forming an interlayer BP-TEOS layer can be omitted.

In addition, it is possible to form the groove for metallization 15 with high precision in size control, because in the etching process by using the resist 11 as a mask (see FIG. 3), the hole 8A for plug part 14B is already formed (at this stage, the BARC layer 10A is formed), and the amount of etching can be managed with the thickness of the interlayer BP-TEOS layer 5.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device comprising the steps of:
    (a) forming successively first and second layers on a semiconductor substrate;
    (b) forming a hole so as to extend through said first and second layers;
    (c) forming a groove for metallization in said second layer so as to selectively extend through said second layer including said hole;
    (d) forming a first electrode layer on the bottom and side of said groove for metallization, while filling the inside of said hole remained, said first electrode layer having a contact part filled in the inside of said hole remained and an electrode part disposed on the bottom and side of said groove for metallization; and
    (e) forming successively an insulating film and a second electrode layer on said electrode part of said first electrode layer, thereby to obtain a capacitor consisting of said electrode part, said second electrode layer and said insulating film.

2. The method of a manufacturing a semiconductor device according to claim 1, further comprising the steps of:
    (f) filling said hole to form an auxiliary layer, which step is performed after said step (b) and before said step (c); and
    (g) removing said auxiliary layer in said hole remained, which step is performed after said step (c) and before said step (d).

3. The method of a manufacturing a semiconductor device according to claim 2, wherein
    said step (a) includes the steps of:
    (a-1) forming said first layer on said semiconductor substrate;
    (a-2) forming a stopper layer on said first layer; and
    (a-3) forming said second layer on said stopper layer,
    said step (b) includes the step of forming said hole so as to extend through said first layer, said stopper layer and said second layer,
    said step (c) includes the steps of:
    (c-1) forming a resist patterned on said second layer; and
    (c-2) performing an etching process of said second layer by using said resist as a mask, to form said groove for metallization, said stopper layer having etching resistance to said etching process, and
    said step (g) includes the step of removing said resist in addition to said auxiliary layer.

4. The method of a manufacturing a semiconductor device according to claim 3, wherein
    said first and second layers include a TEOS layer, and said stopper layer includes a nitride film.

5. The method of a manufacturing a semiconductor device according to claim 3, wherein
    said step (f) includes the step of forming said auxiliary layer on said second layer and also in the inside of said hole, said step (c-1) includes the steps of:
(c-1-1) forming a resist material on the entire surface of said second layer; and
(c-1-2) patterning said resist material to form said resist, and said auxiliary layer includes an anti-reflective coating to prevent the reflection of light at the time of exposure for patterning in said step (c-1-2).

6. The method of a manufacturing a semiconductor device according to claim 5, wherein said anti-reflective coating includes a bottom anti-reflective coating.

7. The method of a manufacturing a semiconductor device according to claim 3, wherein said auxiliary layer and said resist have a characteristic of being able to be removed by an identical removing means, and said step (g) includes the step of removing said auxiliary layer and said resist at the same time, by using said identical removing means.

8. The method of a manufacturing a semiconductor device according to claim 7, wherein said identical removing means includes ashing cleaning.

9. The method of a manufacturing a semiconductor device according to claim 3, further comprising the step of:

(h) forming a first component of a DRAM in the surface of said semiconductor substrate, which step is performed before said step (a), and wherein, said capacitor includes a memory cell capacitor for said DRAM, and said contact part of said first electrode layer is electrically connected to said first component, and said step (a-1) includes the steps of:
(a-1-1) forming a first partial layer on said semiconductor substrate;
(a-1-2) selectively forming a second component of said DRAM on said first partial layer; and
(a-1-3) forming a second partial layer on said first partial layer including said second component, said first layer including said first and second partial layers.

10. The method of a manufacturing a semiconductor device according to claim 9, wherein said first component includes an electrode region of a transistor for selecting said memory cell capacitor, and said second component includes a bit line for selecting said memory cell capacitor.

11. The method of a manufacturing a semiconductor device according to claim 9, wherein said first electrode layer includes a polysilicon layer in which impurity is diffused.

* * * * *